(12) United States Patent
Okawa

(10) Patent No.: US 6,501,155 B2
(45) Date of Patent: *Dec. 31, 2002

(54) SEMICONDUCTOR APPARATUS AND PROCESS FOR MANUFACTURING THE SAME

(75) Inventor: Kazuhiko Okawa, Chino (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,424

(22) Filed: Nov. 23, 1998

(65) Prior Publication Data

US 2002/0008285 A1 Jan. 24, 2002

(30) Foreign Application Priority Data

Dec. 4, 1997 (JP) ............................................. 9-349941

(51) Int. Cl.[7] .................. H01L 23/58; H01L 29/76; H01L 29/94; H01L 29/00; H01L 31/062
(52) U.S. Cl. ..................... 257/652; 257/376; 257/399; 257/519; 257/648
(58) Field of Search ................................. 257/355, 376, 257/398, 399, 400, 546, 547, 648, 652, 305, 354, 519, 395, 396, 397

(56) References Cited

U.S. PATENT DOCUMENTS

| | | | |
|---|---|---|---|
| 4,602,267 A | | 7/1986 | Shirato ......................... 257/358 |
| 5,468,989 A | | 11/1995 | Nishizawa et al. ........... 257/517 |
| 5,567,553 A | * | 10/1996 | Hsu et al. ........................ 430/5 |
| 5,641,982 A | * | 6/1997 | Takahashi .................... 257/398 |
| 5,689,133 A | | 11/1997 | Li et al. ........................ 257/133 |

FOREIGN PATENT DOCUMENTS

| | | |
|---|---|---|
| GB | 2 305 779 | 4/1997 |
| JP | 61-19174 | 1/1986 |
| JP | 4-254381 | 9/1992 |
| JP | 5-75045 | 3/1993 |
| JP | 5-259115 | 10/1993 |
| WO | 97/19516 | 5/1997 |

* cited by examiner

*Primary Examiner*—Tom Thomas
*Assistant Examiner*—Shouxiang Hu

(57) ABSTRACT

To provide a semiconductor apparatus that secures high ESD protection capability and yet reduces leak current.

Cut sections 64-1 and 64-2 are provided in end sections of a second edge 62 of a drain region 22. When a distance between a first edge 60 of a source region 20 and the second edge 62 in an intermediate area is defined as L1, a distance between the first edge 60 and end edges 52-1 and 52-2 of a channel stopper non-implanted region 50 is defined as L1, a relation of L2? L1 is established. By providing the channel stopper non-implanted region 50, the ESD protection capability is improved. Also, by providing the cut sections 64-1 and 64-2 in a manner to satisfy the relation that is L2 is not less than L1, leak current is reduced. The source region 20 may also be provided with a cut section. A contacts or a metal silicide layer in the drain region 22 is provided in an intermediate area being interior with respect to borders between the intermediate area and the respective end sections of the second edge 62. The present invention is also applicable to a lateral type bipolar protection circuit.

19 Claims, 10 Drawing Sheets

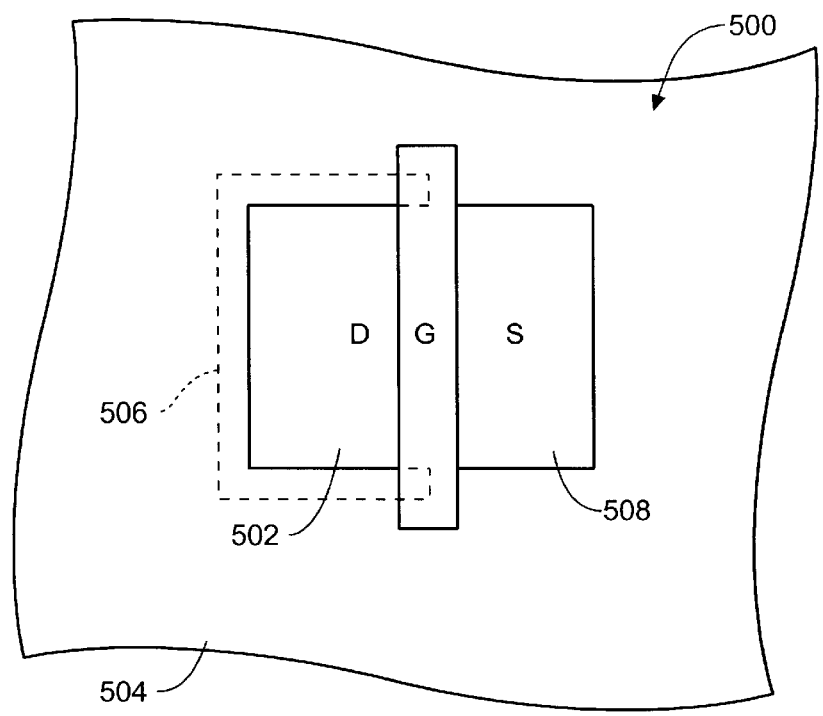
FIG._1A (PRIOR ART)
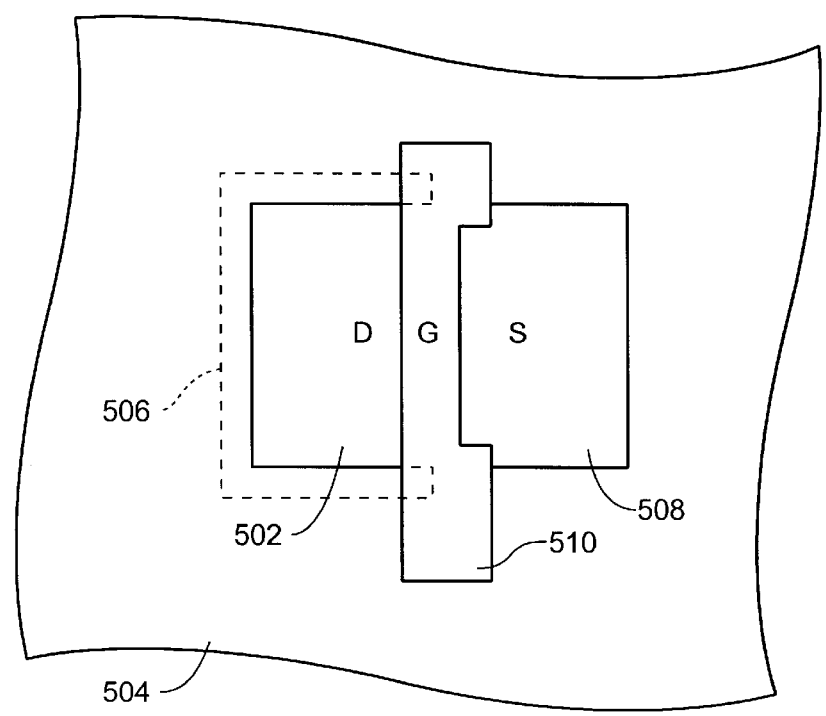
FIG._1B (PRIOR ART)

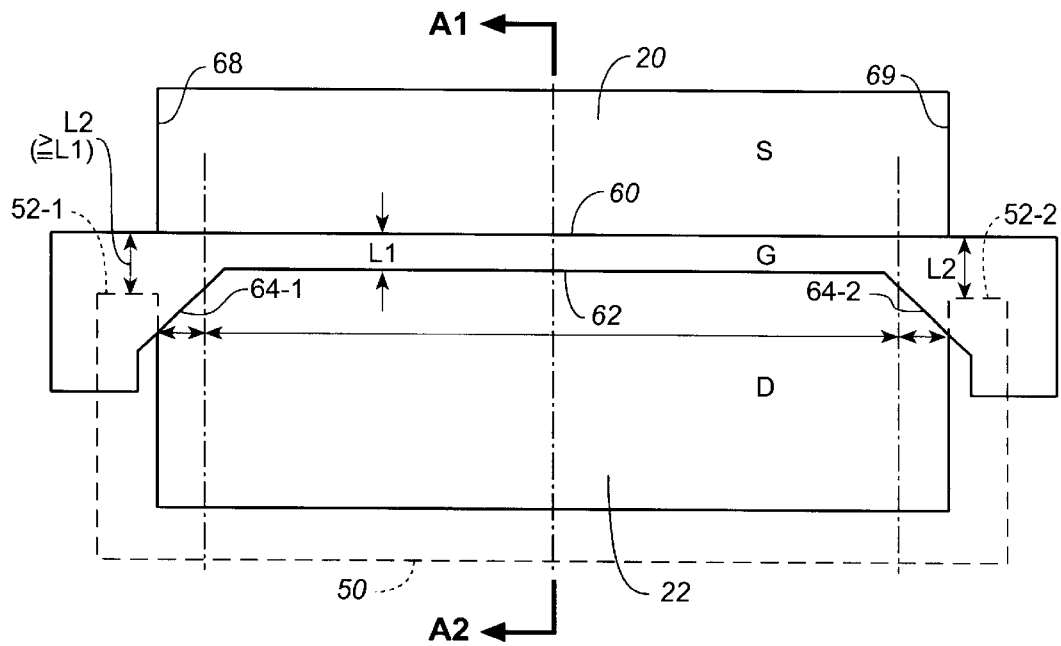
FIG._2A
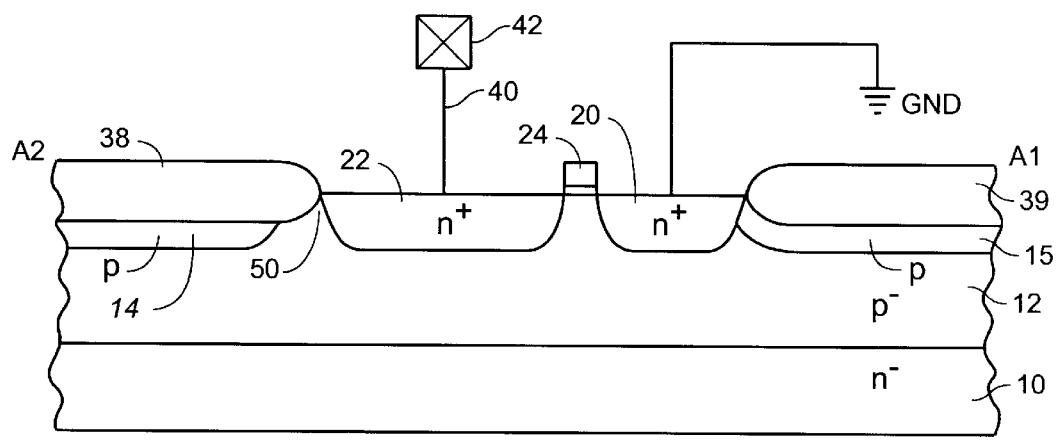
FIG._2B

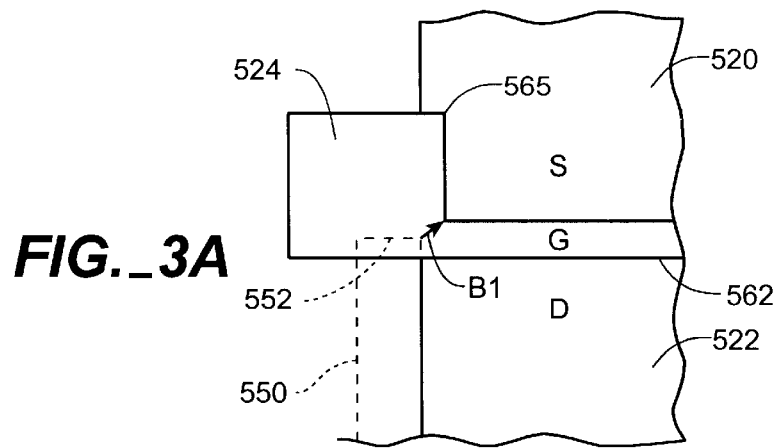
FIG._3A
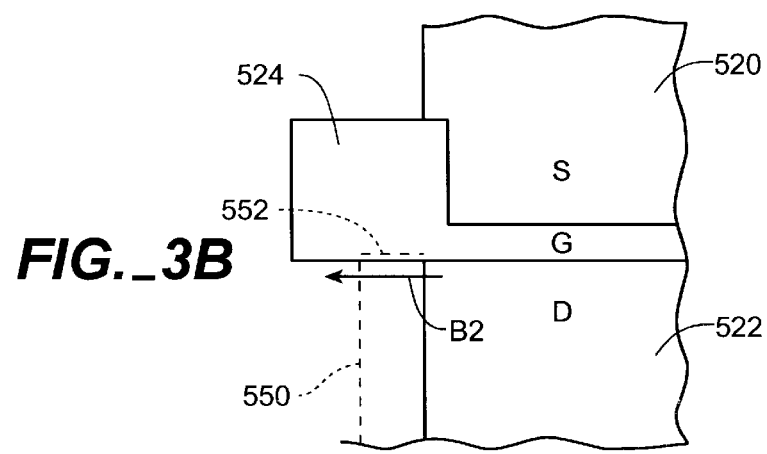
FIG._3B
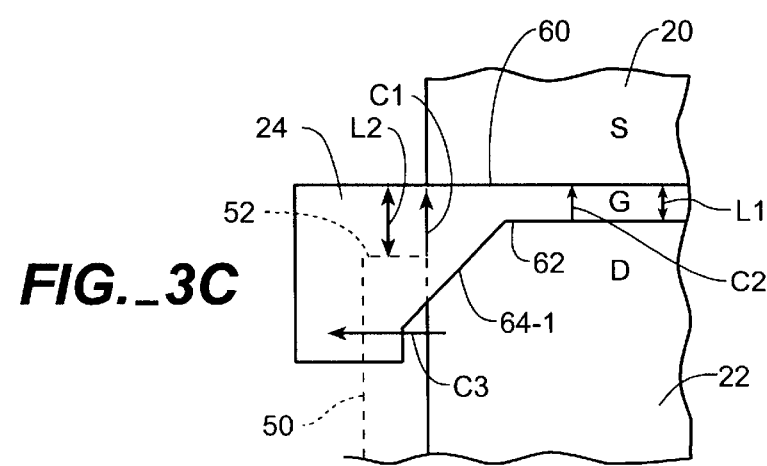
FIG._3C

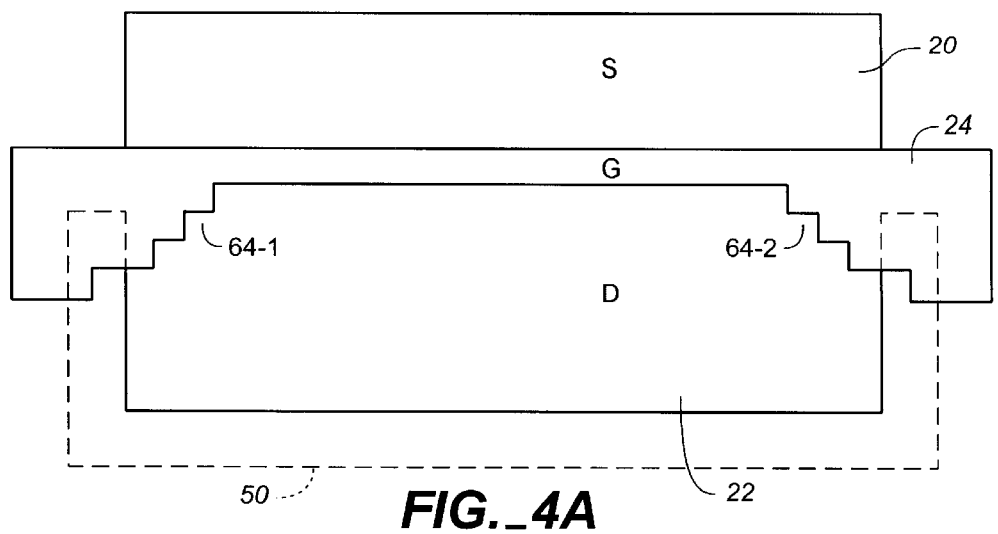
FIG._4A
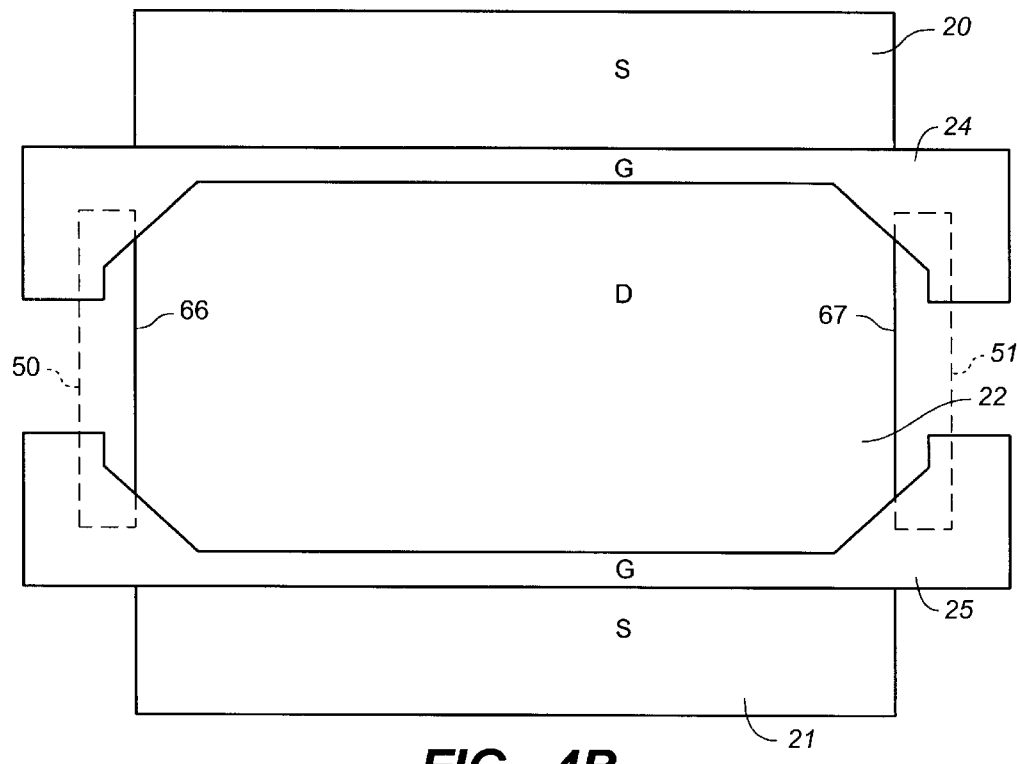
FIG._4B

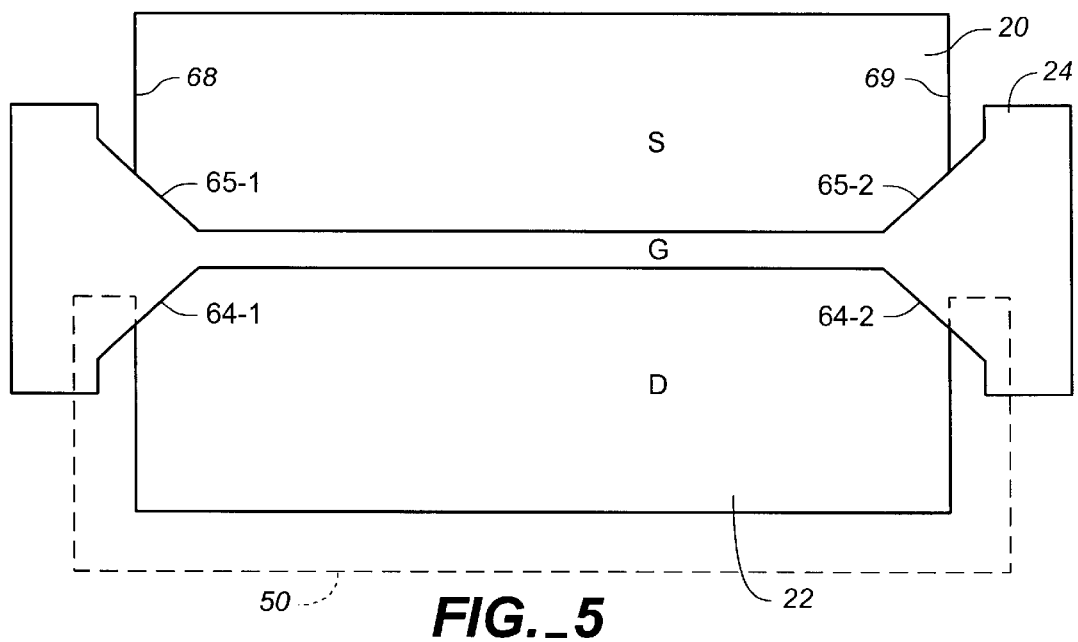
FIG._5
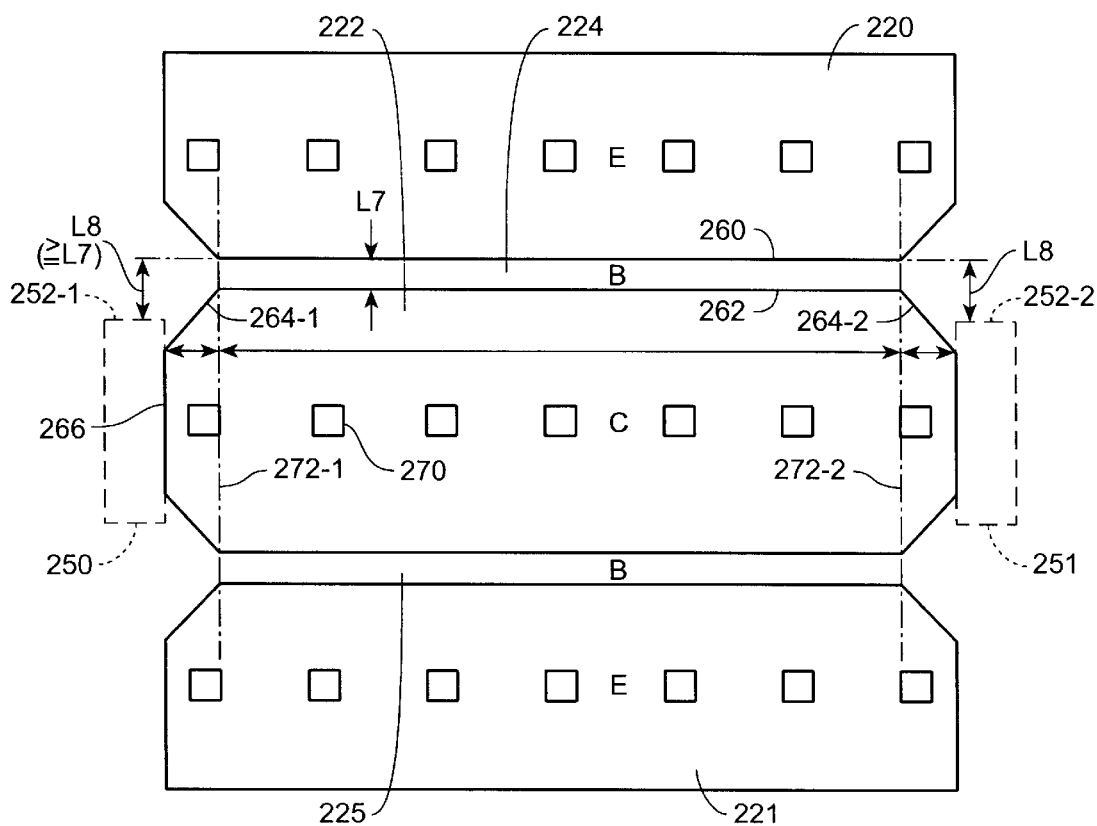
FIG._11

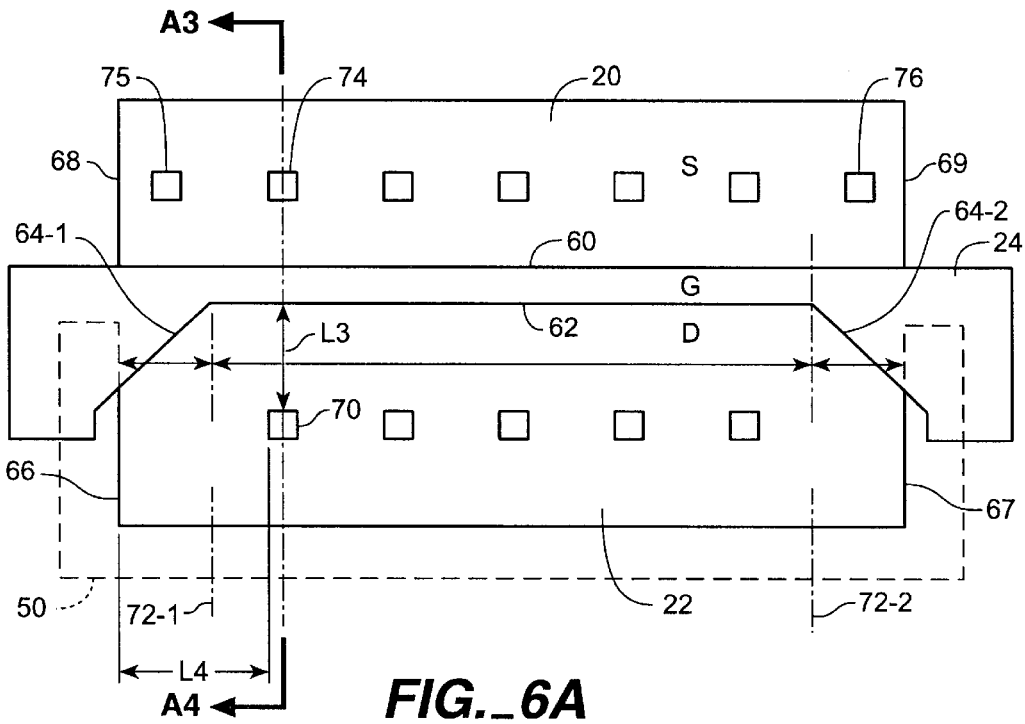
*FIG._6A*
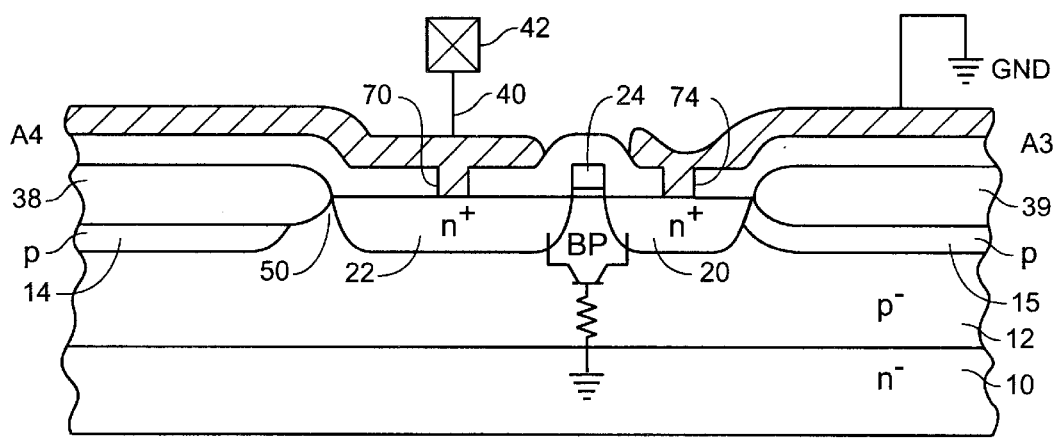
*FIG._6B*

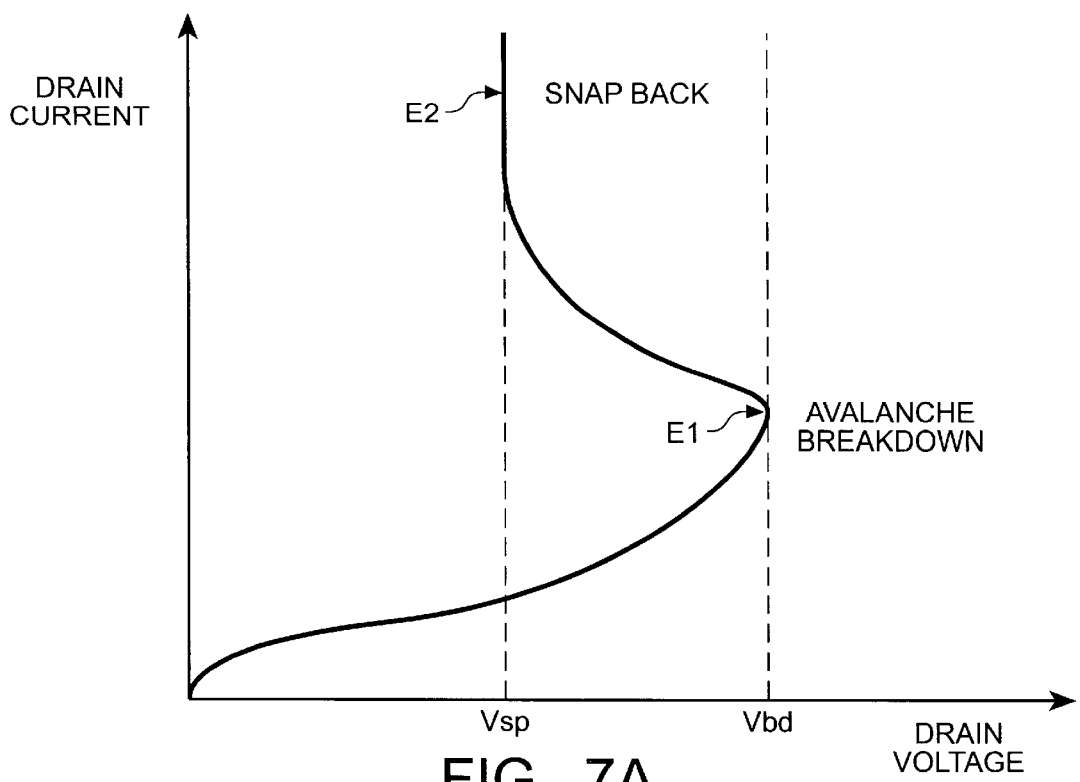
FIG._7A
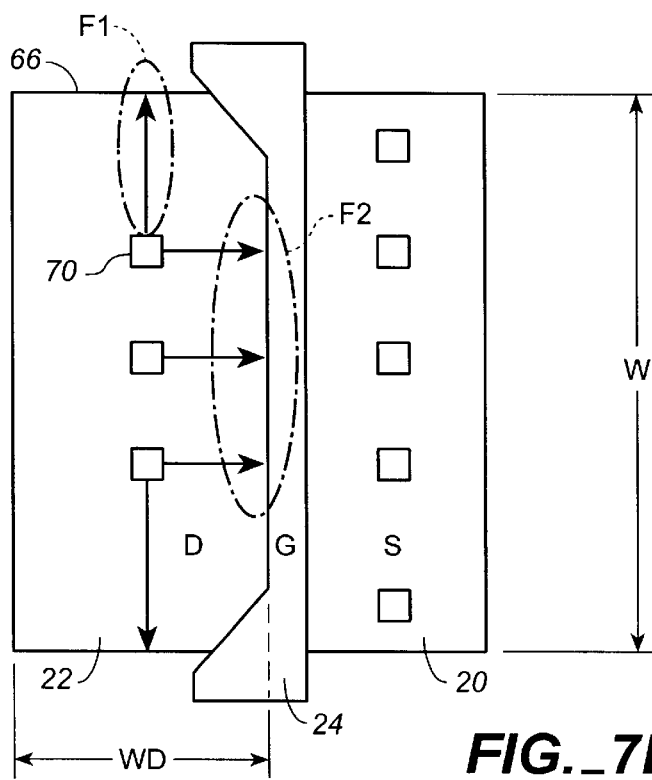
FIG._7B

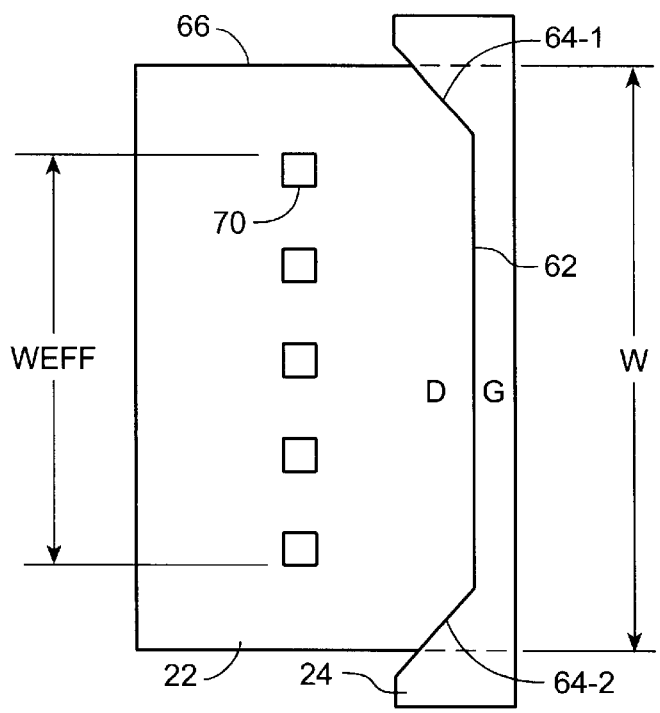
FIG._8A
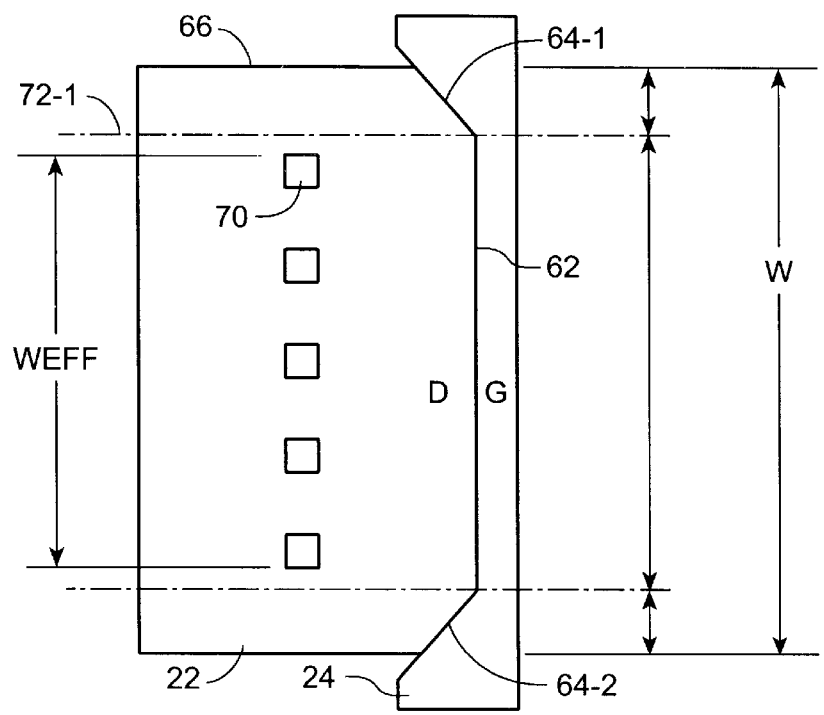
FIG._8B

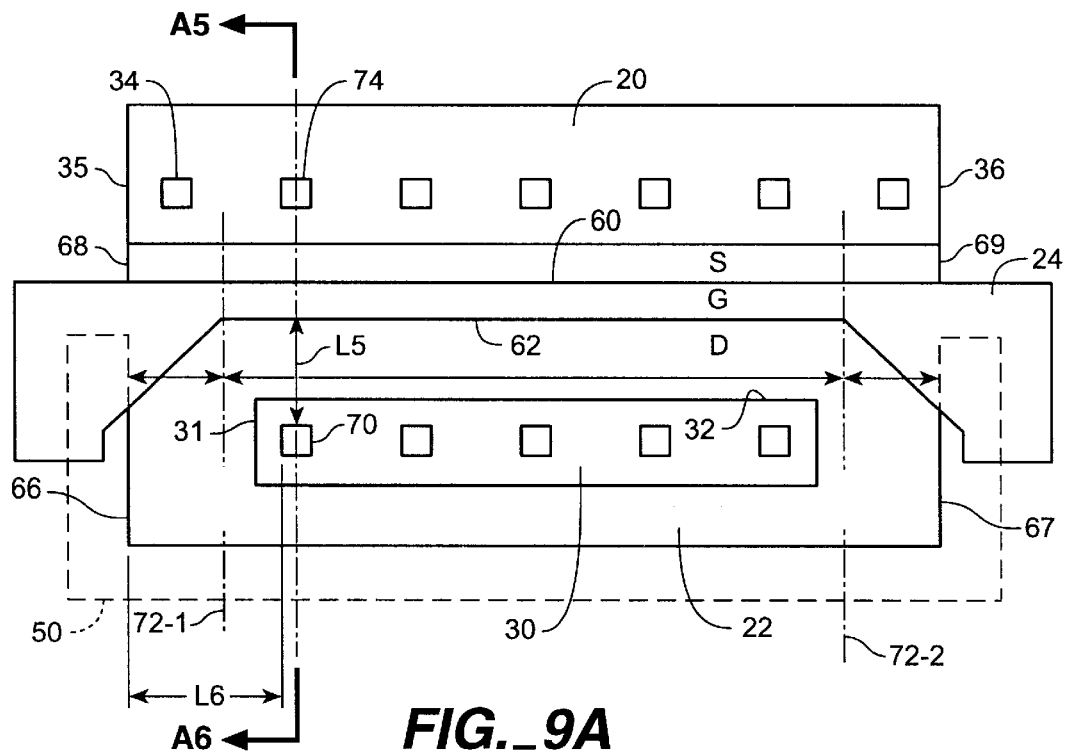
FIG._9A
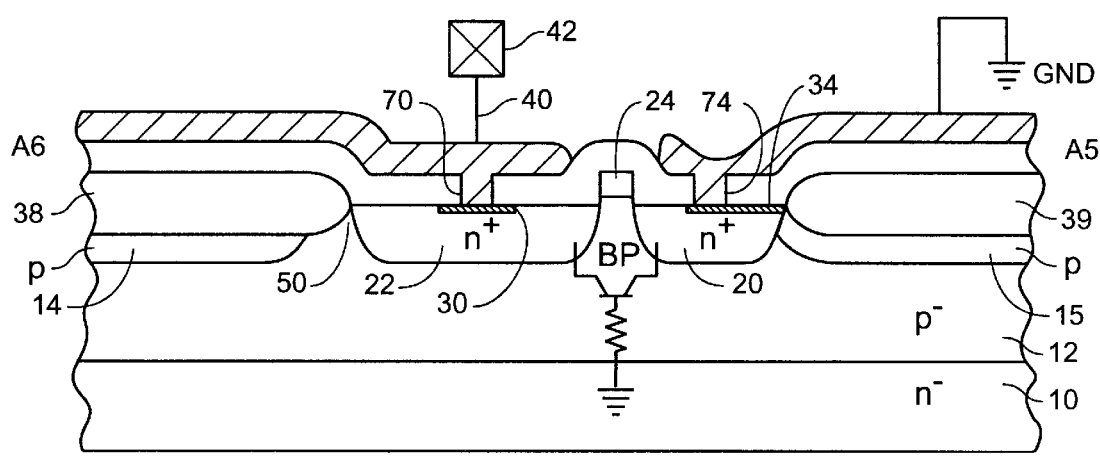
FIG._9B

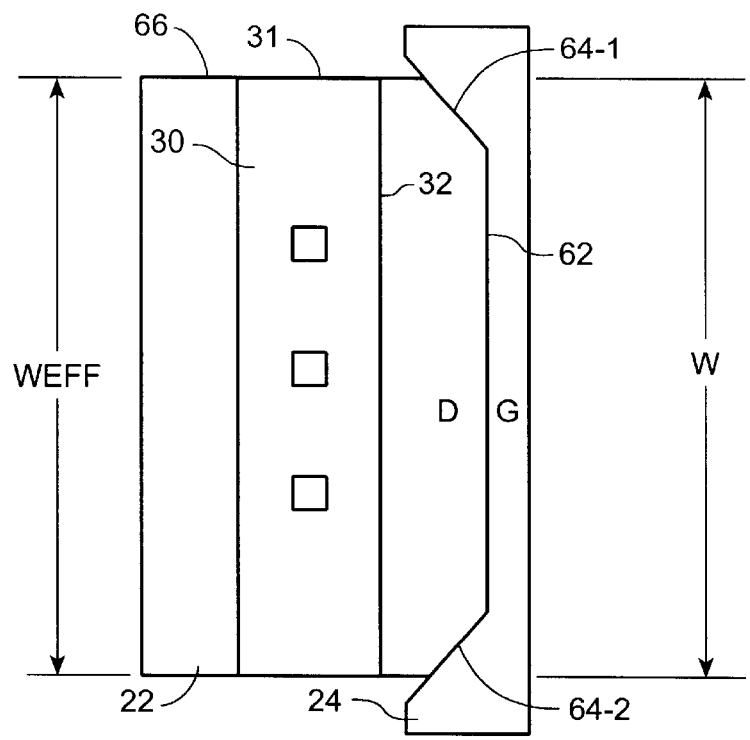
FIG._10A
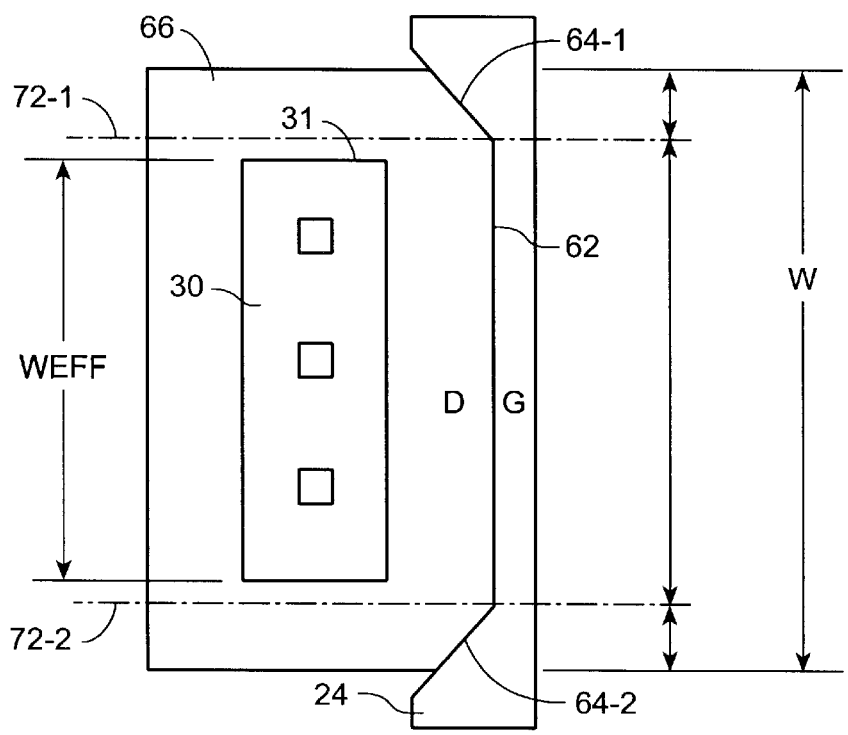
FIG._10B

SEMICONDUCTOR APPARATUS AND PROCESS FOR MANUFACTURING THE SAME

BACKGROUND OF THE INVENTION

1. Field of the Invention

The present invention relates to a semiconductor apparatus, and more particularly to a structure for protecting a circuit from a surge, such as an electrostatic surge and to a process for manufacturing the semiconductor apparatus.

2. Description of the Related Art

In semiconductor apparatuses, the ESD protection capability needs to be improved to protect an internal circuit from a surge such as an electrostatic surge so that the internal circuit is not destroyed by the static electricity. FIG. 1A shows a first one of the conventional techniques for improving the ESD protection capability of an output buffer to be connected to a pad.

In accordance with the first conventional technique, an output buffer 500 has a drain region 502, a field isolation region 504 provided around at least a portion of the drain region 502, and a channel stopper non-implanted region 506 between the field isolation region 504 and the drain region 502. On the other hand, a channel stopper implanted region (field inversion prevention region) is provided between a source region 508 and the field isolation region 504.

In the first conventional technique, the drain region 502 forms a PN junction with a p-type well of low impurity concentration, not with the channel stopper implanted region of high impurity concentration. Accordingly, junction breakdown voltage can be increased and electrostatic destruction by a surge of static electricity is effectively prevented.

However, the first conventional technique shown in FIG. 1A suffers a problem in which large leak current flows between the drain region 502 and the source region 508 because of the presence of the channel stopper non-implanted region 506.

To solve such a problem of the conventional technique, for example, Japanese Laid-open Patent No. 61-19174 teaches a second one of the conventional technique. According to the second conventional technique, both ends of a gate electrode 510 protrude into a source region 508, as shown in FIG. 1B. When the gate length is relatively long, the second technique lowers the leak current.

However, with the advancement of device size miniaturization, when the gate length (channel length) is shorter than, for example, about 0.35 µm, it has been confirmed that non-negligible amount of leak current flows between the drain region 502 and the source region 508 in the structure shown in FIG. 1B.

OBJECTS OF THE INVENTION

The present invention has been made to solve the problems described above, and an object of the present invention is to provide a semiconductor apparatus that secures high ESD protection capability and yet effectively lowers the leak current and to provide a process for manufacturing the semiconductor apparatus.

SUMMARY OF THE INVENTION

To achieve the above-described objects, a semiconductor apparatus in accordance with the present invention includes a first region of a first conductivity type, a first impurity region of a second conductivity type formed in the first region having a first edge, a second impurity region of the second conductivity type formed adjacent to the first impurity region and having a second edge arranged opposite to the first edge, the second edge having end portions and an intermediate area, a wiring layer connected to the second impurity region, a field isolation region formed around at least a portion of the second impurity region, and a channel stopper non-implanted region provided between the second impurity region and the field isolation region. The semiconductor device is characterized in the first edge is separated from the second edge at the intermediate area by a distance of L1 and at the end portions by a distance greater than L1, and wherein an end portion of the channel stopper non-implanted region is separated from the first edge at a distance of L2, where L2 is at least L1.

In accordance with the present invention, the ESD protection capability can be improved by the provision of the channel stopper non-implanted region. Also, the end portion (end edge) of the channel stopper non-implanted region is separated from the first edge at a distance of L2, where L2 is at least L1. As a result, the leak current caused by sub-threshold current is reduced. In particular, in accordance with the present invention, leak current is reduced without being substantially affected by even further device miniaturization.

The present invention is also characterized in that cut sections are provided in both end sections of the first edge of the first impurity region and cut sections are provided in both end sections of the second edges. By this configuration, leak current is further securely lowered.

The present invention is further characterized in that the semiconductor apparatus includes a contact for connecting the second impurity region and the wiring layer, wherein the contact is provided on the side of the intermediate area being interior with respect to borders defined between the intermediate area of the second edge and the respective end portions of the second edge where the cut sections are provided. Also, the present invention is characterized in that the semiconductor apparatus includes a metal silicide layer formed on the surface of the second impurity region, wherein the metal silicide layer is provided on the side of the intermediate area being interior with respect to borders defined between the intermediate area and the respective end portions of the second edge where the cut sections are provided. As a result, along edges of the second impurity region extending transverse to the second edge, electrostatic destruction that may be resulted from avalanche breakdown is effectively prevented.

In accordance with the present invention, preferably, the first and second impurity regions are, respectively, a source region and a drain region of an output buffer. Also, the first and second impurity regions may be, respectively, an emitter region and a collector region of a lateral bipolar type protection circuit.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIGS. 1A and 1B are views to explain problems of the prior art;

FIG. 2A and FIG. 2B shows respectively a plan view of an embodiment of the present invention and a schematically shows a cross-section taken along a line A1–A2 of FIG. 2A;

FIGS. 3A, 3B and 3C are views to explain the advantages of the present embodiment over the prior art;

FIGS. 4A and 4B are views to explain shapes of cut sections and layouts for source region, drain region and gate electrode in accordance with other embodiments of the present invention; FIG. 5 is a view to explain a structure for providing cut sections in a source region;

FIG. 6A and FIG. 6B are respectively a view to explain characteristic features of an embodiment with respect to provision of contacts and a cross-sectional view taken along a line A3–A4 of FIG. 6A;

FIG. 7A is a view to explain the snap-back phenomenon, and FIG. 7B is a view to explain the size difference of current pass areas;

FIGS. 8A and 8B are views to explain the relation between the actual width W and the effective width Weff of a transistor;

FIG. 9A is a view to explain characteristic features of an embodiment relating to provision of a metal silicide layer, and FIG. 9B schematically shows a cross-sectional view taken along a line A5–A6 of FIG. 9A;

FIGS. 10A and 10B are views to explain the relation between the actual width W and the effective width Weff of a transistor; and FIG. 11 is a view to explain a lateral bipolar type protection circuit in accordance with an embodiment of the present invention.

DESCRIPTION OF THE PREFERRED EMBODIMENTS

Hereunder, preferred embodiments of the present invention will be described. In the description below, the first conductive type is p-type and the second conductive type is n-type. Also, a MOS transistor will be described as an embodiment of the present invention. However, the present invention may also be applicable to a structure in which the first conductivity type is n-type and the second conductivity type is p-type. Also, the present invention is applicable not only to MOS transistors but also to other types of transistors, such as, for example, MIS transistors. Furthermore, the present invention is applicable to devices other than transistors, such as, for example, lateral bipolar devices, such as lateral bipolar transistors.

1. Structure of Embodiment of the Present Invention

FIG. 2A shows a plan view of an embodiment of the present invention. FIG. 2B schematically shows a cross-sectional view taken along a line A1–A2 of FIG. 2A.

As shown in FIGS. 2A and 2B, an n-type semiconductor substrate 10 is provided with a p-type well 12 (first region) formed therein. The p-type well is connected to ground potential GND (lower power source potential) through a p-type well tap region or the like (not shown) formed by an appropriate process, such as, diffusion, ion implantation or the like.

An n-type source region 20 (first impurity region) is formed in the p-type well 12 using an appropriate process, such as, diffusion, ion implantation or the like, and connected to ground GND through a contact.

A drain region 22 (second impurity region) is formed next to the source region 20 but separated a predetermined distance from the source region 20. In other words, the drain region 22 is formed next to the source region 20 with a gate electrode 24 being placed in between. The source region 20 are approximately rectangular shape in direction of the plane. The drain region 22 is connected to a wiring layer 40, and the wiring layer 40 is connected to a pad 42.

An output buffer is formed from a transistor composed of the source region 20, the drain region 22 and the gate electrode 24. The output buffer itself functions as a self-protection circuit and a protection circuit for protecting an internal circuit that is connected to the output buffer.

In accordance with the present invention, a field isolation film 38 (field isolation region) is provided around at least a portion of the drain region 22, and a channel stopper non-implanted region 50 is provided between the field isolation film 38 and the drain region 22. In other words, the channel stopper implanted region 14 underlying the field isolation film 38 is separated from the drain region 22.

On the other hand, a channel stopper non-implanted region is not provided at a border between the source region 20 and the field isolation film 39 around the source region 20. In other words, the channel stopper implanted region 15 underlying the field isolation film 39 is connected to the source region 20.

By providing the channel stopper non-implanted region 50 around at least the portion of the drain region 22 in the manner described above, the drain region 22 forms a PN junction with the P-type well of low impurity concentration, and not with the channel stopper implanted region 14 of high impurity concentration. As a result, junction breakdown voltage is increased, and electrostatic destruction that may be caused by a surge, such as an electrostatic surge is effectively prevented.

In accordance with one feature of the present invention, as shown in FIG. 2A, cut sections 64-1 and 64-2 are provided in both of end portions of the drain region 22 at the second edge 62, and distance L1 and distance L2 are set to satisfy the relation that is L2 is not less than L1 (, namely L2 is at least L1).

The second edge 62 of the drain region 22 is arranged opposite to the first edge 60 of the source region 20 that is formed next to the drain region 22. L1 is a distance between the first edge 60 of the source region 20 and the second edge 62 of the drain region 22 in the intermediate area (which correspond to the gate length). On the other hand, L2 is a distance between the first edge 60 of the source region 20 and the end portions 52-1 and 52-2 of the channel stopper non-implanted region 50 (that are opposite to the first edge 60). Namely, the first edge 60 is separated from the second edge 62 at the intermediate area by the distance L1 and the end portions 52-1 and 52-2 of the channel stopper non-implanted region is separated from the first edge 60 at the distance of L2, and L2 is at least L1.

In this manner, the cut sections 64-1 and 64-2 are provided on the side of the drain region 22 in a manner to satisfy the relation that is L2 is not less than L1. As a result, while high ESD protection capability is secured, the leak current is effectively lowered.

In the conventional technique described, for example, in Japanese laid-open patent No. 61-19174, when the gate length becomes short with the advancement of the device miniaturization, a large amount of leak current flows along, for example, a route indicated by B1 of FIG. 3A.

In other words, in a MOS transistor, even when a voltage applied to the gate electrode is lower than the threshold voltage, so-called sub-threshold current flows. The sub-threshold current becomes a major cause of leak current in the MOS transistor. The sub-threshold current $I_{sub}$ is proportional to the gate width (channel width) W and inversely proportional to the gate length (channel length) L, as defined by Formula (1) presented below.

$$I_{sub} \; W/L \qquad (1)$$

In accordance with the conventional technique described in Japanese Laid-open Patent No. 61-19174, a cut section 565 is provided on the side of a source region 520, but no cut section is provided on the side of a drain region 550, as shown in FIG. 3A. Also, an end edge 552 of a channel stopper non-implanted region 550 protrudes beyond an edge 562 of the drain region 522 into the source region 520. Therefore, an area having a gate length shorter than the minimum length (actual gate length) is formed under the gate electrode 524, and sub-threshold current represented by the above Formula (1), namely, leak current indicated, for example, by B1 in FIG. 3A is generated. The leak current becomes greater when out of alignment occurs in mask alignment of a mask that is used to form the channel stopper non-implanted region 550.

One of the techniques to lower the leak current is shown in FIG. 3B. According to this technique, the end edge 552 of the channel stopper non-implanted region 550 is brought closer to the drain region 522. However, in this technique, when a surge such as a surge of static electricity is charged to the drain region 522, an avalanche breakdown indicated by B2 in FIG. 3B occurs, and the transistor is destroyed by the static electricity.

In contrast, in accordance with the present embodiment shown in FIG. 3C, the drain region 22 is provided with the cut section 64-1, and the distance L2 is made greater than the distance L1 (the end portion 52 is brought closer to the drain region 22 with respect to the second edge 62). Accordingly, this prevents formation of an area beneath the gate electrode 24 having a gate length practically shorter than the minimum size (actual gate length). Namely, as clearly appreciated from the above Formula (1), the sub-threshold current that is the major cause of leak current is inversely proportional to the distance L, and therefore, leak current that flows through the route C1 is smaller than that flowing through the route C2 of FIG. 3C. Therefore, when the gate length becomes shorter due to the advancement of device miniaturization, only leak current flowing through the route C2 increases, but leak current flowing through the route C1 does not substantially contribute to the overall increase of the leak current in the transistor. In other words, leak current increases as a result of the presence of the channel stopper non-implanted region below the gate electrode shown in FIG. 3A. In contrast, in accordance with the present embodiment, the increase of the leak current is prevented. Furthermore, in accordance with the present embodiment, the cut section 64 is provide on the side of the drain region 22. As a result, the channel stopper non-implanted region 50 can be disposed in a manner that it securely surrounds the peripheral area of at least the portions of the drain region 22, as shown in FIG. 3C, and thus the transistor is effectively prevented from electrostatic destruction due to avalanche breakdown indicated by C3. In other words, in accordance with the present embodiment, the ESD protection capability is increased and the leak current is reduced.

In the embodiment shown in FIG. 2A, the drain region 22 is provided with chamfered sections at both of the end portions thereof to define the cut sections 64-1 and 64-2. However, the configuration of the cut sections is not limited to the embodiment, and a variety of different configurations may also be applicable. For example, the drain region 22 may be provided with step-like cut sections in both of the end sections thereof to define the cut sections 64-1 and 64-2, as shown in FIG. 4A.

Also, as shown in FIG. 4B, the single drain region 22 may be commonly shared by two source regions 20 and 21. In this case, channel stopper non-implanted regions 50 and 51 are provided along edges 66 and 67 of the drain region 22, respectively.

As shown in FIG. 2A, the cut sections 64-1 and 64-2 are provided only in the drain region 22. This structure, as will be describe below, is advantageous in that contacts in the source region 20 can be disposed at location that is spaced a minimum distance from the edges 68 and 69 of the source region 20. However, in accordance with another embodiment, the cut sections 65-1 and 65-2 may also be provided in the source region 20, as shown in FIG. 5. By providing the cut sections 65-1 and 65-2 in addition to the cut sections 64-1 and 64-2, generation of leak current is more securely prevented.

2. Location of Contacts

A second aspect of the present embodiment is shown in FIGS. 6A and 6B. A contact 70 for connecting the drain region 22 (second impurity region) and the wiring layer 40 is provided in an intermediate area being interior with respect to borders 72-1 and 72-2. The borders 72-1 and 72-2 are defined between the intermediate area of the second edge 62 and the respective end portions of the second edge 62 wherein the cut sections 64-1 and 64-2 are provided. FIGS. 6B schematically shows a cross-sectional view taken along a line A3–A4 of FIG. 6A.

By providing the contact 70 in the manner described above, the transistor is effectively prevented from electrostatic destruction that may be caused by avalanche breakdown of parasitic diodes present in areas along edges 66 and 67 (extending transverse to the second edge 62) of the drain region 22. As a result, leak current is lowered and the ESD protection capability is further improved.

More specifically, when the drain region 22 is charged with a surge, such as an electrostatic surge, a parasitic diode present in the drain region 22 has an avalanche breakdown. At this moment, as indicated by E1 of FIG. 7A, the drain voltage is Vbd. When a bipolar transistor (composed of the drain region 22, the p-type well 12 and the source region 20) shown in FIG. 6B is turned on, the drain voltage is decreased from Vbd to Vsp, as indicated by E2 in FIG. 7A. The phenomenon of lowering the drain voltage is called snap-back. At snap-back, the input impedance of the drain region 22 substantially decreases. Therefore, a charge that may be discharged to the drain region 22 by a surge is readily discharged to grounding GND. Even when a surge of about 200V is charged, the voltage of the drain region is reduced to Vsp=8V.

However, if the contact 70 is disposed adjacent to the edge 66, a diode formed in an area adjacent to the edge 66 has an avalanche breakdown before the bipolar transistor BP is turned on, and a large amount of current flows in the diode. Therefore, the area adjacent to the edge 66 is likely destroyed by electrostatic current before the drain voltage and the input impedance of the drain region 22 are lowered by the snap-back.

In accordance with the present embodiment, the contact 70 is disposed in the intermediate area being interior with respect to the border 72-1. Accordingly, the contact 70 can be spaced a sufficient distance from the edge 66 of the drain region 22. Thus, the bipolar transistor BP can be turned on before an avalanche breakdown takes palace in the parasitic diode present in the area adjacent to the edge 66, and the ESD protection capability is improved.

The width W of a transistor that forms the output buffer is generally large, and the width WD of the drain region 22 is smaller than the width W, as shown in FIG. 7B. The width W of a common output buffer is, for example, approximately 200 |300 μm, and the width WD is, for example, approximately 100 μm. Accordingly, as indicated by F1 and F2 in FIG. 7B, the source region 20 has a current pass area greater than that of the edge 66.

In accordance with the present embodiment, the contact 70 is disposed in the intermediate area being interior with respect the border 72-1, removed from the edge 66. Surge current can flow into the source region 20 that has a greater current pass area. As a result, current concentration is prevented and the ESD protection capability is improved.

As shown in FIG. 8A, in ordinarily, the contact 70 is formed at a location spaced a minimum distance from the edge 66. By doing so, the effective width Weff of the transistor is made substantially equal to the width W, and the transistor operates at a higher speed.

In accordance with the present embodiment, the contact 70 is provided on the side of the intermediate area being interior with respect to the border 72-1, which appears to be contrary to the ordinary way. In other words, when the contact 70 is provided within the intermediate area, a difference between the width W and the width Weff is greater than that of the example shown in FIG. 8A, resulting in a lower transistor performance. However, in accordance with the present embodiment, the transistor performance is sacrificed to a degree in favor of the improvement of the ESD protection capability.

In particular, in the present embodiment, the cut sections 64-1 and 64-2 are provided in the end portions of the second edge 62 of the drain region 22, and therefore the gate length in the end sections is greater. As a result, even if the contact 70 is disposed closer to the edge 66, a greater transistor performance cannot be expected. In this respect, the present embodiment is characterized in that the contact 70 is disposed within the intermediate area. In other words, because it is noticed that locating the contact 70 near the edge 66 does not practically improve the transistor performance because of the presence of the cut section 64-1, the contact 70 is located on the side of the intermediate area and removed from the edge 66 in order to contemplate improvements in the ESD protection capability while limiting the loss of transistor performance within an allowable range.

As shown in FIG. 6A, L3 is a distance between one edge of the contact 70 and the second edge 62 of the drain region 22, L4 is a distance between another edge of the contact 70 and the edge 66 of the drain region 22. The distance L3 and the distance L4 are preferably set to satisfy the relation that is L4 is not less than L3. As a result, the ESD protection capability is further improved.

In the embodiment shown in FIG. 6A, contacts 75 and 76 in the source region 20 are preferably spaced a minimum distance from the edges 68 and 69 of the source region 20. Destruction by electrostatic current does not likely occur along the edges 68 and 69 of the source region 20, and the transistor performance can be improved by disposing the contacts 75 and 76 near the edges 68 and 69.

Provision of the contacts 75 and 76 in the manner described above is particularly effective for the structure shown in FIG. 6A in which the source region 20 is not provided with a cut section. More specifically, when the source region 20 is not provided with a cut section, contacts to be provided in the source region 20 can be disposed near the edges 68 and 69 to contemplate the improvement of the transistor performance.

3. Provision of Metal Silicide Layer

In recent years, with the advancement of device miniaturization of semiconductor apparatuses, a source region and drain region become shallower and a thickness of a gate electrode become thinner, resulting in an increased parasitic resistance of the source region, the drain region and the gate electrode. The increased parasitic resistance results in a lower operation speed of the circuit. A salicide process is used to lower the parasitic resistance at the source region, the drain region and the gate electrode. With respect to the salicide process, for example, Japanese Laid-open Patent No. 5-75045 and Japanese Laid-open Patent No. 5-259115 describes the conventional techniques.

In a typical salicide process, a metal film of titanium, cobalt, tungsten, molybdenum, tantalum or the like is sputtered on the entire surface of a semiconductor substrate having a source region, a drain region and a gate electrode that have already being formed on the substrate, and a thermal treatment is conducted. As a result, silicon of the source region, the drain region and the gate electrode and the deposited metal are alloyed to form a metal silicide layer. Thereafter, the remaining metal that is not alloyed is removed. As a result, a low resistant metal silicide layer is formed in a self-alignment manner with respect to the source region, the drain region and the gate electrode. By forming the low resistant metal silicide layer on the surface of the source region, the drain region and the gate electrode by the salicide process, parasitic resistance of the source region, the drain region and the gate electrode is substantially lowered. As a result, the operation speed of the circuit is greatly improved.

A third aspect of the present embodiment is shown in FIGS. 9A and 9B. As shown in FIGS. 9A and 9B, a metal silicide layer 30 that is formed on the surface of the drain region 22 (second impurity region) is provided on the intermediate area being interior with respect to the borders 72-1 and 72-2. FIG. 9B schematically shows a cross-sectional view taken along line A5–A6 of FIG. 9A.

By providing the metal silicide layer 30 in the manner described above, the transistor is effectively prevented from electrostatic destruction that may be caused by avalanche breakdown of parasitic diodes present in areas along edges 66 and 67 of the drain region 22. As a result, leak current is lowered and the ESD protection capability is further improved.

More specifically, when the drain region 22 is charged with a surge of current, if the distance between an edge of the metal silicide layer 30 and the edge 66 of the drain region 22 is short, a diode formed in an area adjacent to the edge 66 has an avalanche breakdown before the bipolar transistor BP shown in FIG. 9B turns on, and large current flows in the diode. As a result, the area of the edge 66 is likely destroyed by electrostatic current before the drain voltage and the input impedance of the drain region 22 are lowered by the snap-back.

In accordance with the present embodiment, the metal silicide layer 30 is provided in the intermediate area being interior with respect to the border 72-1. Accordingly, the edge 31 of the metal silicide layer 30 is spaced an ample distance from the edge 66 of the drain region 22, and therefore the bipolar transistor BP is turned on before the parasitic diode present at the edge 66 has an avalanche breakdown. This feature improves the ESD protection capability.

As shown in FIG. 10A, ordinarily, the edge 31 of the metal silicide layer 30 is draw closer to the edge 66 of the drain region 22, and more preferably, the edge 31 and the edge 66 are brought together to coincide with one another. As a result, the effective width Weff of the transistor becomes equal to the width W, and the transistor can operate faster.

In accordance with the present embodiment, the edge 31 of the metal silicide layer 30 is placed on the side of the intermediate area being interior with respect to the border 72-1, which appears to be contrary to the ordinary way. In other words, when the edge 31 is located on the side of the intermediate area, the effective width Weff becomes small compared to the width W, and the transistor performance is lowered. However, in accordance with the present embodiment, the transistor performance is sacrificed to a degree in favor of the improvement of the ESD protection capability.

In particular, because it is noticed that bringing the edge 31 closer to the edge 66 does not practically improve the transistor performance, the edge 31 is located on the side of the intermediate area. As a result, the ESD protection capability is improved while the loss of transistor performance is limited within an allowable range.

As shown in FIG. 9A, L5 is a distance between the edge 32 of the metal silicide layer 30 and the second edge 62 of the drain region 22, and L6 is a distance between the edge 31 of the metal silicide layer 30 and the edge 66 of the drain region 22. The distance L5 and the distance L6 are preferably set to satisfy the relation that is L6 is not less than L5. As a result, the ESD protection capability is more securely improved.

In the embodiment shown in FIG. 9A, the edges 35 and 36 of the metal silicide layer 34 formed on the surface of the source region 20 are preferably brought closer to the respective edges 68 and 69 as much as possible. More preferably, the edges 35 and 36 are brought to coincide with the respective edges 68 and 69. Destruction by electrostatic current is not likely occur along the edges 68 and 69 of the source region 20, and the transistor performance can be improved by bringing the edges 35 and 36 to coincide with the respective edges of 68 and 69. Provision of the metal silicide layer 34 in the manner described above is particularly effective for the structure of FIG. 9A in which the source region 20 is not provided with a cut section.

The present invention is not limited to the embodiments described above, and a variety of modifications with the subject matter of the present invention is possible.

For example, the present invention is applicable to a variety of other devices other than output buffers. For example, as shown in FIG. 11, the present invention is applicable to a lateral bipolar type protection circuit formed from emitter regions 220 and 221 (first impurity region), a collector region 222 (second impurity region), and base regions 224 and 225. In this case, cut sections 264-1 and 264-2 are provided on end sections of a second edge 262 of the collector region 222. Also, a distance L8 between a first edge 260 of the emitter region 220 and end edges (end portions) 252-1 and 252-2 of a channel stopper non-implanted region 250 is made greater that a distance L7 between the first edge 260 and the second edge 262. Furthermore, contacts 270 (or metal silicide layer) are preferably provided in an intermediate area being interior with respect borders 272-1 and 272-2.

The present invention is not only applicable to n-type transistors but also applicable to p-type transistors.

A layout for the drain region, source region, gate electrode, metal silicide layer, and contacts is not limited to the embodiment described above, and a variety of modification can be made.

Configurations of the cut sections and the channel stopper non-implanted region are not limited to the embodiments described above, and a variety of modification can be made.

A manufacturing processes for forming channel stopper non-implanted regions can be modified in a variety of different manners.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor apparatus comprising:
    a first region of a first conductivity type;
    a first impurity region of a second conductivity type formed in said first region and having a first edge;
    a second impurity region of said second conductivity type formed proximate to said first impurity region and having a second edge arranged opposite to said first edge;
    a channel stopper implanted region formed at least along a side of said second impurity region excluding said second edge;
    a channel stopper non-implanted region provided between said second impurity region and said channel stopper implanted region;
    a conductive layer having a center section with an edge refined by a straight line coincident with a center portion of said second edge;
    wherein said channel stopper non-implant region does not extend over any non-bending extension of said straight line; and
    wherein end portions of said conductive layer are gradually expanded in width and defined by two extension edges toward the side of said second impurity region and each of said two extension edges crosses said Channel stopper non-implanted region, and said channel stopper implanted region extends to and in direct contact with a perimeter of said first impurity region excluding said first edge.

2. A semiconductor apparatus according to claim 1, further having a wiring layer connected to said second impurity region, and wherein:
    said first impurity region has a rectangular shape;
    the distance separating said first edge from said second edge at said center portion is defined as L1, and the distance separating said first edge from said channels topper non-implanted region is greater than L1.

3. A semiconductor apparatus according to claim 2, wherein end sections of said second edge form cut sections.

4. A semiconductor apparatus according to claim 3, wherein said cut sections are partially defined by said conductive layer, and said conductive layer is a gate layer extending at least partially over said channel stopper non-implant region along a side of said channel stopper non-implant region adjoining said second impurity region.

5. A semiconductor apparatus according to claim 1, wherein the first and second impurity regions are, respectively, a source region and a drain region of an MOS transistor, the area separating said first and second impurity regions being the channel region of said MOS transistor, and said conductive layer is part of a gate electrode of said MOS transistor.

6. A semiconductor apparatus according to claim 1, wherein the first and second impurity regions are, respectively, a source region and a drain region of an output buffer.

7. A semiconductor apparatus according to claim 1, wherein end sections of said first edge form cut sections.

8. A semiconductor apparatus according to claim 1, wherein end sections of said second edge form cut sections and end sections of said first edge form cut sections.

9. A semiconductor apparatus according to claim 8, wherein the first and second impurity regions are, respectively, a source region and a drain region of an output buffer.

10. A semiconductor apparatus according to claim 1, further comprising a contact for connecting the second impurity region to a wiring layer on the surface of the second impurity region.

11. A semiconductor apparatus according to claim 10, wherein the first and second impurity regions are, respectively, a source region and a drain region of an output buffer.

12. A semiconductor apparatus according to claim 1 further comprising a metal silicide layer formed on a surface of the second impurity region.

13. A semiconductor apparatus according to claim 12, wherein the first and second impurity regions are, respectively, a source region and a drain region of an output buffer.

14. A semiconductor device comprising:
   a first region and a second region of first conductivity type, said first region having a first edge and said second region having a second edge opposite said first edge;
   a channel region of second conductive type between said first and second regions and within said first and second edges;
   a channel-stopper non-implanted region along an outer perimeter of said first region not facing said channel region;
   a channel-stopper implanted region along a perimeter of said channel-stopper non-implanted region opposite said first region; and
   a gate electrode over said channel region and having a center section with an edge defined by a straight line coincident with a center portion of said first edge;
   wherein said non-implant region does not extend over any non-bending extension of said straight line; and
   wherein end portions of said gate electrode are gradually expanded in width and defined by two extension edges toward the side of said first region, and each of said two extension edges crosses said channel-stopper non-implanted region, and said channel stopper implanted region extends to and in direct contact with a perimeter of said second impurity region excluding said second edge.

15. The semiconductor device of claim 14 wherein:
   a width-span of said channel-stopper non-implanted region is defined as the distance from said first region to said channel-stopper implanted region;
   each of said end portions of said gate electrode has an extension arm at least partly covering said channel-stopper non-implanted region along a side of said first region, at least a portion of said extension arm of said gate electrode not extending across the width,span of said channel stopper non-implanted region; and a portion of said extension arm of said gate electrode extends from said channel-stopper implanted region to a point within said channel-stopper non-implanted region not reaching said first region.

16. The semiconductor device of claim 15, wherein said gate electrode is coupled to receive a voltage potential sufficient for impeding avalanche current under its extension arm.

17. The semiconductor device of claim 15, wherein said channel region has a substantially uniform length section defining its mid-section adjacent to said center section of said gate electrode and an increasing length section adjacent to each of said end portions of said gate electrode.

18. The semiconductor device of claim 17, wherein said channel-stopper non-implanted region extends within said increasing length section of said channel region and does not extend to said uniform length section of said channel region.

19. The semiconductor of claim 17, wherein said first and second regions are wider than said mid-section of said channel region, placement of conductive contacts within said first region are restricted to within a width equal to the width of said mid-section, and placement of conductive contacts within said second region extends beyond a width wider than said first width.

* * * * *

UNITED STATES PATENT AND TRADEMARK OFFICE
CERTIFICATE OF CORRECTION

PATENT NO. : 6,501,155 B2
DATED : December 31, 2002
INVENTOR(S) : Kazuhiko Okawa It is certified that error appears in the above-identified patent and that said Letters Patent is hereby corrected as shown below:

<u>Column 10,</u>
Line 41, change "refined" to -- defined --.

Signed and Sealed this

Fifth Day of August, 2003

JAMES E. ROGAN
*Director of the United States Patent and Trademark Office*